United States Patent
Andrea et al.

(10) Patent No.: US 10,211,618 B2
(45) Date of Patent: Feb. 19, 2019

(54) METHOD AND CIRCUIT FOR DETECTING AN ELECTRIC ARC IN A CIRCUIT, AND SWITCHING DEVICE USING SUCH A CIRCUIT

(71) Applicants: Leach International Europe SA, Sarralbe (FR); Universite de Lorraine, Nancy (FR)

(72) Inventors: Jonathan Andrea, Salon de Provence (FR); Patrick Schweitzer, Heillecourt (FR); Serge Weber, Villers les Nancy (FR); Etienne Tisserand, Heillecourt (FR); Marc Bournat, Sarreguemines (FR)

(73) Assignees: LEACH INTERNATIONAL EUROPE SA, Sarralbe (FR); UNIVERSITE DE LORRAINE, Nancy (FR)

( * ) Notice: Subject to any disclaimer, the term of this patent is extended or adjusted under 35 U.S.C. 154(b) by 0 days.

(21) Appl. No.: 15/116,044

(22) PCT Filed: Feb. 3, 2015

(86) PCT No.: PCT/EP2015/052110
§ 371 (c)(1),
(2) Date: Aug. 2, 2016

(87) PCT Pub. No.: WO2015/114151
PCT Pub. Date: Aug. 6, 2015

(65) Prior Publication Data
US 2017/0170644 A1   Jun. 15, 2017

(30) Foreign Application Priority Data
Feb. 3, 2014  (FR) ..................... 14 50817

(51) Int. Cl.
*H02H 1/00* (2006.01)
*H01H 9/30* (2006.01)
(Continued)

(52) U.S. Cl.
CPC ......... *H02H 1/0015* (2013.01); *G01R 31/333* (2013.01); *H01H 9/30* (2013.01);
(Continued)

(58) Field of Classification Search
CPC .......... H02H 1/00–1/0015; H02H 3/00; H02H 3/02; H02H 3/04; H02H 3/46;
(Continued)

(56) References Cited

U.S. PATENT DOCUMENTS

| | | | |
|---|---|---|---|
| 6,504,692 | B1 | 1/2003 | Macbeth |
| 7,656,626 | B2 | 2/2010 | Carton |

(Continued)

FOREIGN PATENT DOCUMENTS

| | | |
|---|---|---|
| EP | 0 639 879 | 2/1995 |
| EP | 1 443 622 | 8/2004 |
| EP | 1 845 599 | 10/2007 |

OTHER PUBLICATIONS

International Search Report dated Apr. 15, 2015 out of PCT Priority Application No. PCT/EP2015/052110 (6 pages including English translation).

(Continued)

*Primary Examiner* — Tung X Nguyen
*Assistant Examiner* — David Frederiksen
(74) *Attorney, Agent, or Firm* — Brinks Gilson & Lione; John C. Freeman (57) ABSTRACT

A method and a circuit for detecting an electric arc in an electric circuit supplied with AC current during a supply period includes measuring at least one input signal (S) among a current (I) and an input voltage (U) of the electric (Continued)

circuit, supplying a warning signal (A1) to indicate that an electric arc occurs when the input signal (S) is constant over at least one portion of the supply period, digitally sampling the input signal (S) during the measurement thereof according to predetermined levels and, to identify that the input signal (S) is constant, determining the frequency at which each level is reached by the input signal (S) over a predetermined time window, comparing the frequency of each level with a predetermined warning threshold, and issuing the warning signal if the frequency of at least one of the levels is higher than the warning threshold.

8 Claims, 5 Drawing Sheets

(51) Int. Cl.
    *H01H 33/26*     (2006.01)
    *G01R 31/333*     (2006.01)
    *H02H 3/46*     (2006.01)
    *H01H 9/50*     (2006.01)
    *H02H 3/04*     (2006.01)

(52) U.S. Cl.
    CPC .............. *H01H 9/50* (2013.01); *H01H 33/26* (2013.01); *H02H 3/04* (2013.01); *H02H 3/46* (2013.01)

(58) Field of Classification Search
    CPC ............ H01H 9/30–9/50; H01H 33/00; H01H 33/02; H01H 33/26; G01R 31/02; G01R 31/024; G01R 31/025; G01R 31/333
    See application file for complete search history.

(56) References Cited

U.S. PATENT DOCUMENTS

| | | | |
|---|---|---|---|
| 2003/0030448 A1* | 2/2003 | Sapir ................... | H02H 1/0015 324/536 |
| 2003/0227290 A1 | 12/2003 | Parker | |
| 2006/0001433 A1* | 1/2006 | Bouton ................ | H02H 1/0015 324/536 |
| 2007/0208981 A1* | 9/2007 | Restrepo ............. | H02H 1/0015 714/731 |
| 2007/0242399 A1 | 10/2007 | Carton | |
| 2008/0201021 A1 | 8/2008 | Wang | |
| 2010/0027176 A1* | 2/2010 | Kawate ................ | H02H 1/0015 361/86 |
| 2010/0033888 A1* | 2/2010 | Dougherty ........... | G01R 31/026 361/93.2 |
| 2012/0275071 A1* | 11/2012 | Gutierrez ............. | H02H 1/0015 361/42 |
| 2013/0038971 A1* | 2/2013 | Ward ................... | H02H 1/0015 361/86 |
| 2014/0071564 A1* | 3/2014 | Kim ..................... | H02H 1/0015 361/42 |
| 2014/0168843 A1* | 6/2014 | Privitera ............. | G01R 31/025 361/93.1 |

OTHER PUBLICATIONS

Written Opinion of the International Search Authority dated Apr. 15, 2015 out of PCT Priority Application No. PCT/EP2015/052110 (12 pages).

Article, Andrea et al., "Principle of Arc Fault Detection for Solid State Power Controller", 2012 IEEE 58$^{th}$ Holm Conference on Electrical Contacts, Sep. 23-26, 2012, ISBN 978-1-4673-0778-9, 6 pages.

* cited by examiner

METHOD AND CIRCUIT FOR DETECTING AN ELECTRIC ARC IN A CIRCUIT, AND SWITCHING DEVICE USING SUCH A CIRCUIT

This application claims priority to International Application No. PCT/EP2015/052110 filed Feb. 3, 2015 and to French Application No. 1450817 filed Feb. 3, 2014: the entire contents of each are incorporated herein by reference.

BACKGROUND

The present invention relates to a method for detecting an arc in an electrical circuit, to a detection circuit implying the said method and to a switching device comprising such a circuit.

In the description herein below, the references between square brackets ([ ]) refer to the list of references presented at the end of the text.

In electrical circuits, certain faults may lead to the generation of undesirable electrical arcs. Two main types of faults are differentiated.

The first type of fault occurs when a gap is created between two elements of the circuit in the path of the current. At low voltage, no current flows; however, with a voltage that depends in particular on the width of the spacing, an arc is established in the spacing and the current flows. This is then referred to as a fault of the series arc type. In the case of an alternating current, an arc is established upon each half-alternation.

The second type of fault occurs when a spurious conductor tends to short-circuit the current source of the electrical circuit. Here again, a gap subsists between a main conductor and the spurious conductor. With a low voltage, no current flows between the two conductors, but when the voltage increases, an arc is established in the gap and the current flows forming a short-circuit. A similar phenomenon can occur when a conducting liquid simultaneously wets two conductors with different potentials. This is then referred to as a fault of the parallel arc type.

Local heating takes place which can be dissipated if the arc is not frequent, but which may lead to destructive consequences if it occurs frequently or in a repeated fashion. Moreover, the power supply for the circuit is weakened. Furthermore, the short-circuit current can also heat the spurious conductor and cause a fire.

A protection device for an electrical circuit has already been provided comprising a device for detecting an electrical arc. The document EP 1 845 599 A1 [1] shows one example of such devices. The detection is based on the measurement of the power supply current and voltage of the electrical circuit and on the digital analysis of these signals. Several detection units compare the values of the signals, of their derivative and of their integration to thresholds in order to supply signals for assisting the decision, each detection unit being adapted to one particular type of electrical arc. Decision means receive the signals for assisting the decision in order to supply a control signal for opening the electrical circuit and rendering it safe.

In another document [2], a circuit for detecting an electrical arc is applied to the semiconductor power control. In this document, the use is also provided of decision means receiving the results from several detection units. In one of them, a detection by interpolation of the input signal taken from between the current and the voltage is provided. The signal is under-sampled then interpolated by a polynomial. Subsequently, the interpolation is compared with the original signal and a warning is generated if the difference exceeds a predetermined threshold.

Even though this method of detection works well, it requires many complex calculations to be carried out, which accordingly requires a high-performance, and hence costly, detection circuit.

The invention aims to provide a method for detecting an electrical arc that is simple to implement, efficient and does not require significant processing means.

SUMMARY

With these objectives in mind, one subject of the invention is a method for detecting an electrical arc in an electrical circuit powered by alternating current according to a power supply period, according to which at least one input signal from between a power supply current and a power supply voltage for the electrical circuit is measured, characterized in that a warning signal is supplied indicating that an electrical arc occurs when the input signal is constant over at least a part of the power supply period.

The inventors have observed that, when an arc of the series type appears in an electrical circuit powered with alternating current, the arc disappears when the current becomes zero. The current then remains substantially equal to zero for a certain period of time until the voltage across the gap is sufficient to re-initiate the arc. The current is re-established and abruptly increases. The detection of this period during which the current is zero allows the presence of at least one arc in the electrical circuit to be characterized. In a similar manner, with a fault of the parallel type, the electrical circuit is practically in short-circuit and the voltage is then very low while being substantially constant. The monitoring of the voltage or of the current allows one or the other type of fault to be detected. Being "constant" is understood to mean the fact that the signal is for example situated within a band whose width is small, of the order of the amplitude of the noise on the signal or of the noise from an electrical arc. It may also be defined that the signal is constant when its time derivative is less than a predetermined threshold.

According to one particular disposition, the input signal is digitally sampled when it is measured according to predetermined levels and, in order to identify that the input signal is constant, the frequency at which each level is reached by the input signal is determined over a predetermined time window, the frequency of each level is compared with a predetermined warning threshold, and the warning signal is delivered if the frequency of at least one of the levels is greater than the warning threshold. Using the digitization of the input signal, it is relatively straightforward to quantify the frequency at which a level is reached. From there, it is also straightforward to determine whether, for at least one of the levels, the frequency exceeds a warning threshold. If the input signal is constant for a certain period of time, the same level will be detected several times. Upon each measurement corresponding to this level, the value of the frequency is augmented. The exceeding of a threshold for the value of the frequency is the sign that the signal is constant for a certain interval within the period. It is not necessary to calculate either an integral or a derivative by this method, a fact which limits the processing requirements.

According to one constructive disposition, a frequency memory is used to store the frequencies of the levels, the frequency memory comprising registers and a first address bus receiving the sampled value of the input signal, addition means are used to increment by 1 one of the registers to which the value supplied on the first address bus points, a first in-first out memory is furthermore used that receives the sampled value of the input signal on an input and that supplies a shifted value on an output, a second address bus of the frequency memory receiving the shifted value, and subtraction means are used to decrement by 1 the register to which the shifted value on the second address bus points, the addition, the subtraction and the shift in the first in-first out memory being carried out within the same cycle. The frequency memory allows the number of times when the level is reached by the input signal to be memorized for each level, and this is done for a period of time determined by the size of the first in-first out memory and the duration of one cycle. Indeed, the memory for a given level is incremented when the said level is presented on the first address bus, then decremented when the same level is presented later on the second address bus by the first in-first out memory, after a number of cycles corresponding to the size of the first in-first out memory. The counting method is simple because it allows a memory to be directly used without a microcontroller, with simply an adder and a subtractor, as will be more easily seen in the following.

In a complementary manner, other warning signals are established according to at least one other method from amongst a detection by spectral analysis, a detection by interpolation filter, a time differentiation method, and these signals are combined in order to determine a command for turning off the electrical circuit. The ability is thus available to take into account various types of electrical arcs which may have different signatures and hence different methods for detecting them. The combination of the signals also allows the methods to be correlated with one another in order to obtain a reliable detection.

In a particular instance, the input signal is the current signal, the determination of the turn-off command taking into account the intensity of the current signal during the warning period, the frequency of the warning signals and their average duration. The detection of one occurrence of an electrical arc is not sufficient in itself to consider that the electrical circuit is at risk. However, the higher the intensity of the current during the arc and the longer the duration of the arcs, the more it is considered that the circuit is at risk and needs to be quickly protected. On the other hand, if the intensity is low or if the arcs do not last very long, it is possible to leave the power to the circuit on despite the arcs.

According to one particular disposition, a command to turn off is issued if a pair frequency of the warning signals and average duration of the warning signals is above a first curve that has a decreasing hyperbolic form, or if a pair warning current intensity and average duration is above a second curve with a decreasing hyperbolic form. Thus, on the one hand, the frequency of the warning signals and the average duration of the warning signals and, on the other hand, the warning current intensity and the average duration of the warning signals are combined in order to apply to the circuit a limit beyond which a command is issued for the cut-out of the electrical circuit. The limit may also be expressed by the fact that the product of the two members of the pair is below a limit. It goes without saying that these criteria are applied over a time window, in such a manner that old events are not taken into account.

Another subject of the invention is a detection circuit for detecting the presence of an electrical arc in an electrical circuit powered by alternating current according to a power supply period, the detection circuit comprising measurement means for establishing at least one input signal from between a voltage signal and a current signal respectively representative of the voltage and of the current powering the electrical circuit, the detection circuit being configured to deliver a warning signal indicating that an electrical arc is occurring, characterized in that the detection circuit delivers the warning signal when the input signal is constant over at least a part of the power supply period.

Another subject of the invention is an electrical switching device comprising switching means for opening and closing an electrical circuit powered with alternating current according to a power supply period and a detection circuit for controlling the switching means, characterized in that the detection circuit is such as previously described.

BRIEF DESCRIPTION OF THE DRAWINGS

The invention will be better understood and other features and advantages will become apparent from the description that follows, the description making reference to the appended drawings amongst which.

DETAILED DESCRIPTION

Figure 1:
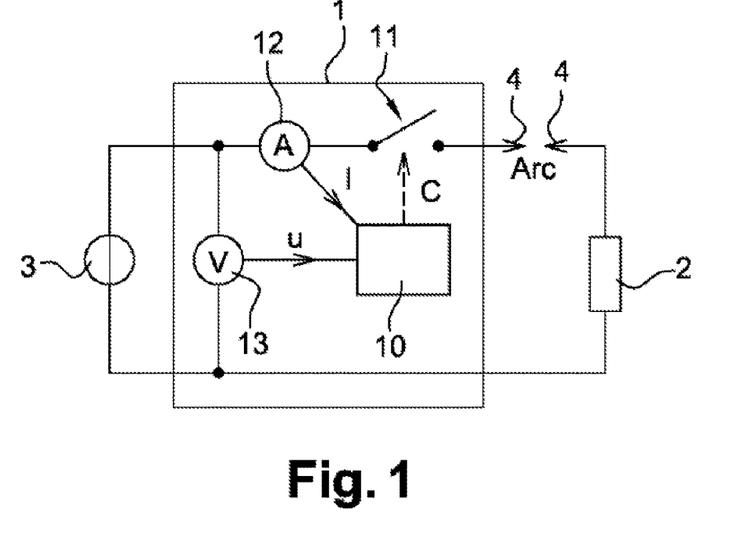
FIG. 1 is a diagram of an electrical circuit comprising a detection circuit according to the invention.

An electrical circuit is shown generically in FIG. 1. Such a circuit comprises a load 2 supplied by a source of AC power 3 via an electrical switching device 1. A fault in the electrical circuit capable of generating an electrical arc is symbolized by two opposing touch points 4 with a gap between them. The power source 3 delivers a periodic current according to a power supply period.

The switching device 1 comprises a detection circuit 10 designed to control a switch 11 on at least one branch of the electrical circuit, means for measuring the current 12 flowing in the circuit delivering a current signal I to the detection circuit 10 and means for measuring the voltage 13 delivering a voltage signal U to the detection circuit 10. The detection circuit 10 implements a method for detecting an electrical arc and controls the opening of the electrical circuit by the switch 11 if it is determined that a fault likely to be dangerous has been detected. The detection circuit 10 may also perform more conventional functions for protecting against over-currents or for remote control. These functions are not detailed in the following part of the document.

Figure 2:
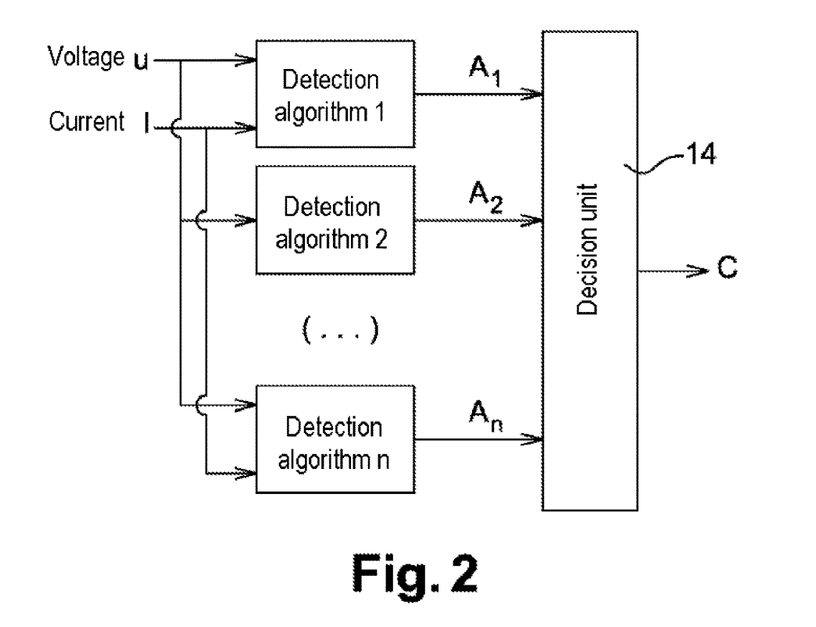
FIG. 2 is a diagram of the logic implemented by the detection circuit in FIG. 1.

The detection circuit 10 implements several detection algorithms 1 to n, in order to detect several types of electrical arcs and to render the detection reliable. As shown in FIG. 2, each algorithm receives at least one of the measured signals (I, U), then analyses it, then transmits a warning signal A1 to An to a decision unit 14. The decision unit 14 performs a synthesis of the warning signals A1 to An and determines a turn-off command signal C for the switch 11.

According to a first of the algorithms of the method for detecting an electrical arc, an input signal is measured, in this case the current signal I, and a warning signal is supplied A1 indicating that an electrical arc is occurring when the input signal is constant over at least a part of the power supply period.

Figure 3:
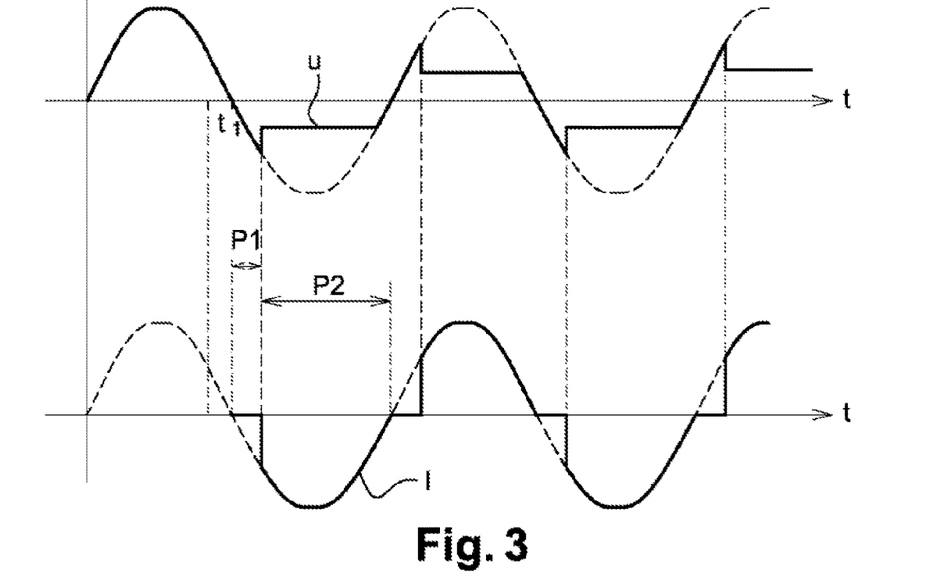
FIG. 3 is a timing diagram of a voltage signal and of a current signal measured by measurement means of the detection circuit in FIG. 1.

Indeed, referring to FIG. 3 which shows on the lower graph the current signal I measured by the current measurement means 12 while a fault generating an arc is present in the circuit starting from a time t1, the current is characterized by a first phase P1 in which the fault is an opening of the circuit and prevents the current from flowing. However, when the power supply voltage is high enough, an arc is established at the location of the fault and the current flows through the arc recovering a level corresponding substantially to where it would be in the absence of a fault. A form of alternation is therefore recovered during a second phase P2, until the point where the current again falls to zero. The arc then disappears until the second phase P2 of the following half-period. The first phase P1 therefore corresponds to a phase during which the current is constant. The detection of this phase P1 allows the presence of a fault generating an arc in the circuit to be characterized.

In the same way, referring to the upper graph in FIG. 3 which shows the voltage signal U measured by the current measurement means at the same time as the current I, the voltage U follows the sinusoidal power supply voltage in the first phase P1. When the arc appears, the measured voltage U is essentially determined by the voltage for maintaining the arc and hence appears substantially constant. The detection of this phase P2 of constant voltage allows the presence of a fault generating an arc in the circuit to be characterized.

Figure 4:
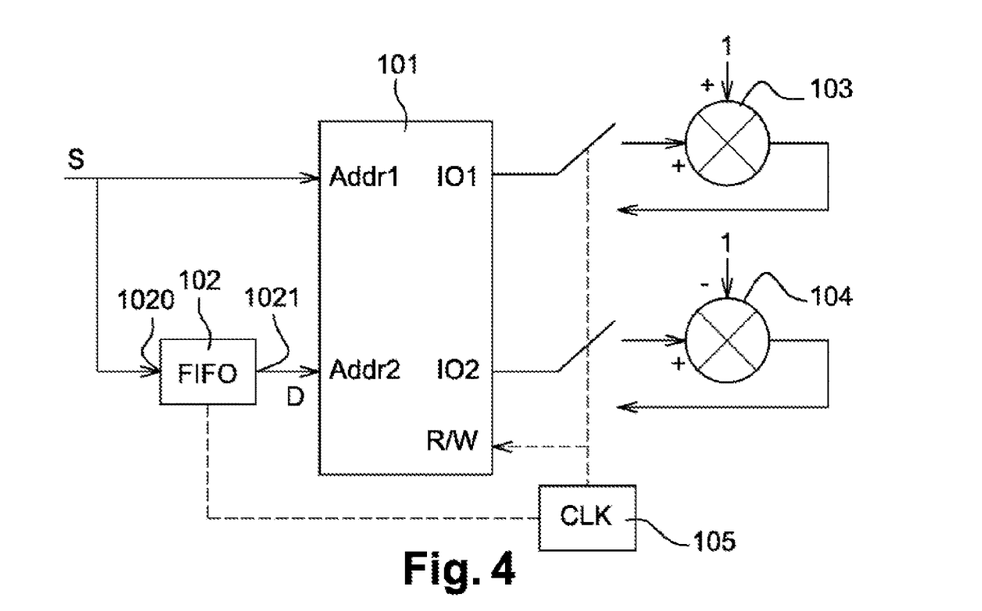
FIG. 4 is a diagram of one embodiment for a part of the detection circuit in FIG. 1.

In one exemplary embodiment for implementing the detection method, the detection circuit 10, such as shown in FIG. 4, comprises a frequency memory 101 for storing the frequencies of the levels, a first in-first out memory 102, addition means 103, subtraction means 104 and a clock 105. The frequency memory 101 comprises registers and a first address bus Addr1 receiving a sampled value of the input signal S according to predetermined levels. The addition means 103 are configured for incrementing by 1 the register to which the value supplied on the first address bus Addr1 points from amongst the whole set of registers. The first in-first out memory 102 receives the sampled value of the input signal S on an input 1020 and supplies a shifted value D on an output 1021. The frequency memory 101 comprises a second address bus Addr2 receiving the shifted value D from the output 1021 of the first in-first out memory 102. The subtraction means 104 are configured for decrementing by 1 the register to which the shifted value D on the second address bus Addr2 points. The addition carried out by the addition means 103, the subtraction carried out by the subtraction means 104 and the shift in the first in-first out memory 102 are carried out in the same time cycle determined by a clock signal CLK supplied by the clock 105.

In order to identify that the input signal S is constant, each register of the frequency memory 101 is examined and the frequency of each level corresponding to a predetermined warning threshold is compared, and the warning signal A1 is delivered if the frequency of at least one of the levels is higher than the warning threshold.

In operation, the clock 105 operates at a predetermined frequency and delivers the clock signal CLK with a constant cycle duration. At each cycle, the value of the signal as sampled is presented at the input of the first in-first out memory 102 and is stored in the said memory. The value is displaced at each cycle in the memory and is presented on the output of the first in-first out memory 102 after the number of cycles corresponding to the number of registers of the first in-first out memory 102, in other words after a shift duration corresponding to the product of the duration of the clock cycle and of said number of registers.

Thus, when the sampled signal has a value at a given moment in time, and when the content of the corresponding register is incremented by 1 by the addition means 103, the same register is decremented by the subtraction means 104 after the shift duration. It therefore no longer has an influence on the content of the frequency memory 101. Thus, the content of the frequency memory 101 corresponds to the analysis of the signal solely over a predetermined time window, of the shift duration. This shift duration is preferably chosen to be less than a power supply period. The signal is sampled for example over 8 bits, which corresponds to a frequency memory 101 of 256 registers.

Other algorithms delivering warning signals may be combined with that which has just been described for determining the turn-off command of the electrical circuit.

A second algorithm for example implements a detection by spectral analysis. The principle of the detection by spectral analysis is based on the composition of the frequency content of the signals from electrical arcs.

Figure 5:
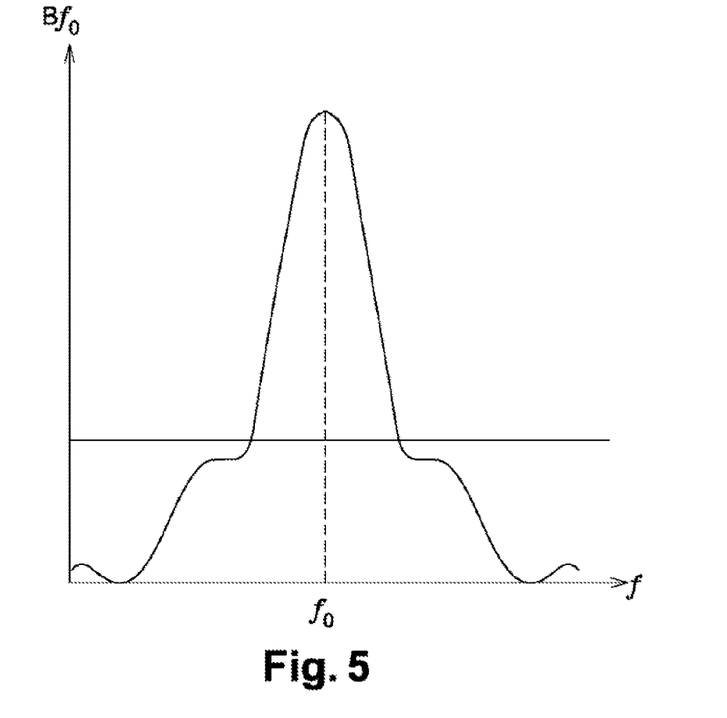
FIG. 5 is a frequency diagram for the detection of a frequency implemented in the diagram in FIG. 7.

The calculation uses three base frequencies f0, f0+mΔf and f0−mΔf. The formula provided is written:

$$B_{f0} = \frac{|A_{f0-m\Delta f}|^2}{\beta} + |A_{f0}|^2 + \frac{|A_{f0+m\Delta f}|^2}{\beta}$$

where Af0 is the sampled signal and Bf0 is the frequency analysis signal. The frequency difference mΔf represents the difference between two close frequencies and depends on the resolution Δf used for the analysis. The coefficient β is greater than 1 and must be calculated so that Bf0 is, on the one hand, continuously increasing between 0 and f0, and on the other hand, continuously decreasing between f0 and infinity. When this condition is met, the curve in FIG. 5 is obtained.

Figure 6:
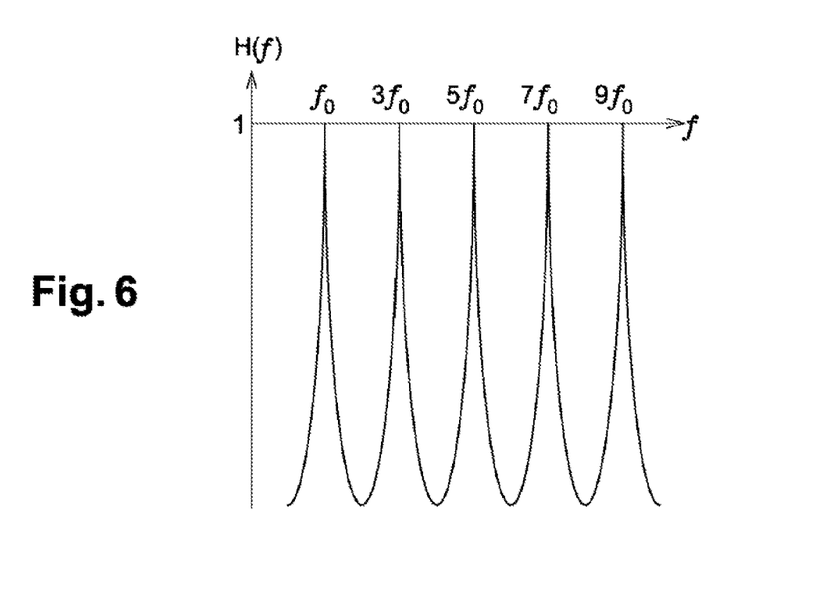
FIG. 6 is a frequency diagram of a filter of the diagram in FIG. 7.
Figure 7:
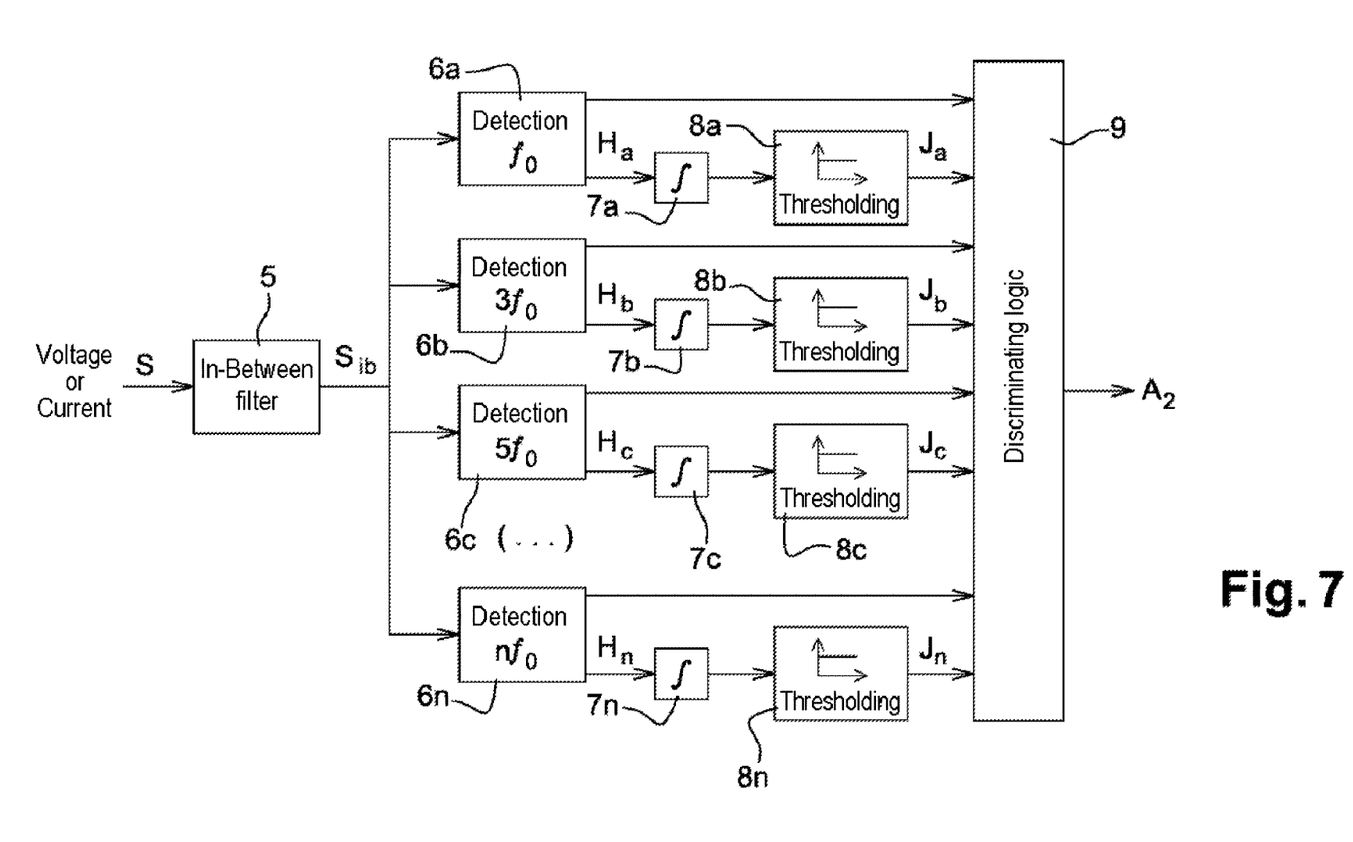
FIG. 7 is a functional block diagram of an algorithm implemented by the detection circuit in FIG. 1.

It is possible to duplicate this detection principle according to the number of harmonics to be monitored. Of course, the higher the desired number of harmonics, the greater will be the quantity of resources needed. When only the odd or even harmonics of the signal are of interest at the same time, a filter 5 called "in-between filter" is employed which receives the input signal S. The ideal transmission function of the filter 5 is shown in FIG. 6. As the diagram in FIG. 7 shows, the filtered signal Sib supplied by the filter 5 is sent to the input of a series of frequency detectors 6a, 6b, 6c . . . 6n, each detector being dedicated to one of the odd harmonic frequencies with respect to a fundamental frequency f0. Each detector 6a, 6b, 6c . . . 6n applies the analysis according to FIG. 5. The detection signal Ha, Hb, Hc . . . Hn, supplied by each of the detectors 6a, 6b, 6c . . . 6n is sent to a summer 7a, 7b, 7c . . . 7n performing a sum over a sliding time window. The sum is transmitted to a comparator 8a, 8b, 8c . . . 8n which carries out a thresholding and which delivers a thresholding signal Ja, Jb, Jc . . . Jn, with two states, switching from one state to the other when the sum exceeds a predetermined value. The thresholding signals Ja, Jb, Jc . . . Jn and the detection signals Ha, Hb, Hc . . . Hn are transmitted to a synthesizer unit 9 which delivers a warning signal as a function of all of the thresholding and detection signals. The presence of an arc is characterized by random variations, and hence by the absence of a dominant frequency. The synthesizer unit 9 verifies that the harmonics are almost all present for a sufficiently long time to deliver a warning signal A2 indicating the presence of an arc.

A third algorithm implements a detection by interpolation filter. This detection method is based on the oversampling of the signals and belongs to the methods of time-domain predictions. It is, more exactly, a method of interpolation that is used for carrying out a prediction of the signal. The error signal is subsequently calculated by performing the difference between the real signal and the predicted signal. The presence of an electrical arc fault is often characterized by an abrupt variation of the signal (either a voltage drop or a jump in current) which leads to the appearance of a difference. When the difference is too large, an alarm signal A3 is triggered. This method is based on the Lagrange interpolation equations. This is described in detail in the document [2] at the paragraph 111 and this description is incorporated as a reference.

A fourth algorithm implements a time differentiation method. The principle of this algorithm is to compare the values of the input signal S with a time difference E corresponding to one or more periods. For this purpose, the following absolute value is evaluated:

$$E(t)=|S(t)-S(t-T)|$$

where T is a multiple of the period of the input signal S and t is time. In an electrical circuit without a fault, the input signal S has a regular period, and the difference from one period to another is zero. In contrast, if a fault generating an arc appears, the successive periods differ from one another, and the difference is no longer zero, which enables a warning signal A4 to be generated.

Figure 8:
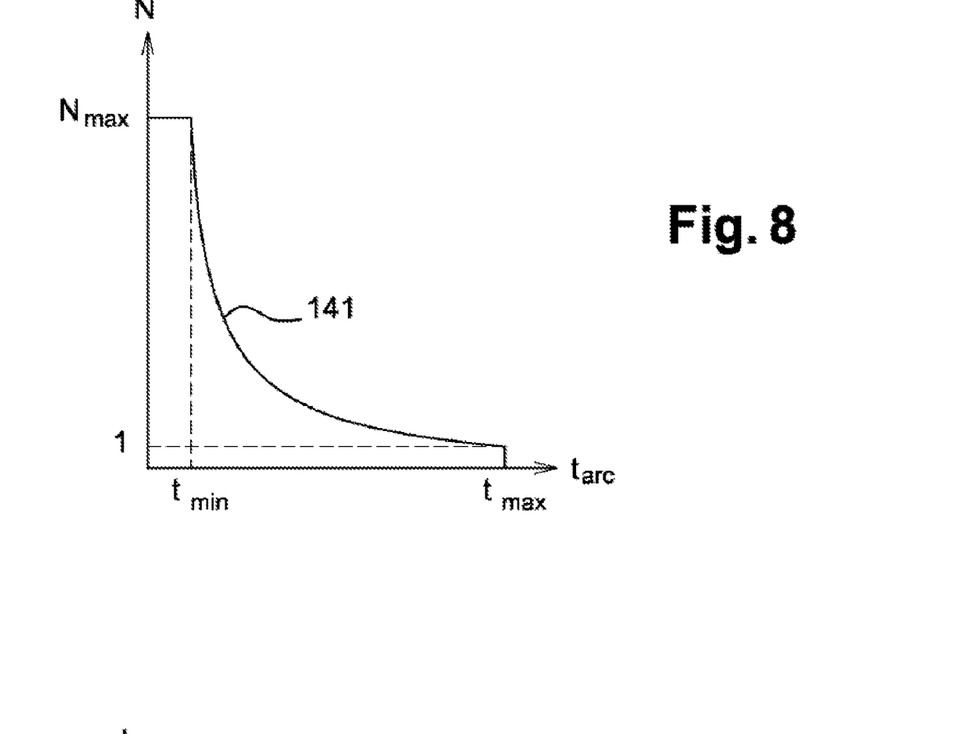
FIGS. 8 and 9 are diagrams illustrating the operation of a decision unit illustrated in FIG. 2.
Figure 9:
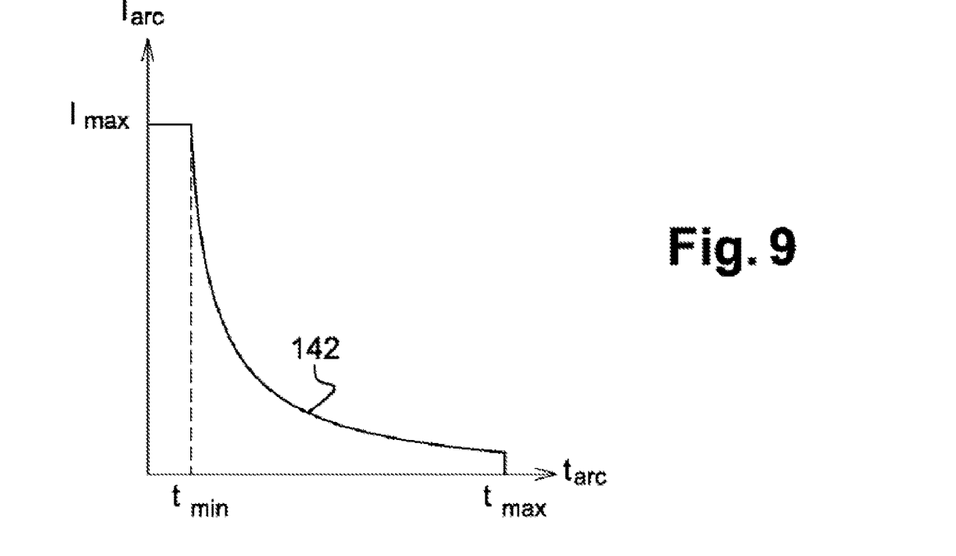

The decision unit 14 takes into account all of the warning signals delivered by the various algorithms for determining the turn-off command signal C. The determination of the turn-off command C takes into account the average intensity of the current signal I during the warning period, the frequency of the warning signals and their average duration. FIGS. 8 and 9 show diagrams representing a first and a second limiting curve as a function of the duration of the warning signal and respectively of the frequency of the arc and of the intensity of the arc current. The first curve 141, in FIG. 8, has a decreasing hyperbolic form, limited to a limiting arc duration $t_{max}$ and to a limiting arc frequency $N_{max}$. A turn-off command is issued if the pair frequency N of the warning signals and average duration $t_{arc}$ of the warning signals is above the first curve 141. The second curve 142, in FIG. 9, has a decreasing hyperbolic form, limited to the limiting arc duration $t_{max}$ and to a limiting intensity of arc current $I_{max}$. A turn-off command is issued if the pair warning current intensity and average duration $t_{arc}$ is above the second curve 142.

LIST OF REFERENCES

[1] EP 1 845 599 A1: published on 17 Oct. 2007
[2] "Principle of Arc Fault Detection for Solid State Power Controller", J. Andrea, O. Zirn, M. Bournat, ISBN 978-1-4673-0778-9 in Electrical Contacts (Holm), 2012 IEEE 58th Holm Conference on Electrical Contacts.

The invention claimed is:

1. A method for detecting an electrical arc in an electrical circuit supplied with alternating current according to a power supply period, comprising:
   operating a detection circuit to measure at least one input signal (S), from between a power supply current (I) measured by a current measurement device and a power supply voltage (U) measured by a voltage measurement device, to the electrical circuit;
   operating the detection circuit to supply a warning signal (A1) indicating that an electrical arc is occurring when the input signal (S) is constant over at least a part of the power supply period;
   using a clock to digitally sample the input signal (S) when it is measured according to predetermined levels;
   determining over a predetermined time window a respective frequency at which each respective level of the predetermined levels is reached by the input signal (S) to identify that the input signal (S) is constant;
   comparing the frequency of each level with a predetermined warning threshold; and,
   delivering the warning signal if the frequency of at least one of the levels is greater than the warning threshold and controlling an opening of the electrical circuit by a switch.

2. The method according to claim 1, wherein the detection circuit comprises:
   a frequency memory for storing the frequencies of the levels, the frequency memory comprising registers and a first address bus (Addr1) receiving the sampled value of the input signal (S),
   addition means for incrementing by 1 one of the registers to which the value supplied on the first address bus (Addr1) points,
   a first in-first out memory receiving the sampled value of the input signal (S) on an input and supplying a shifted value (D) on an output, a second address bus (Addr2) of the frequency memory receiving the shifted value (D), and
   subtraction means for decrementing by 1 the register to which the shifted value on the second address bus (Addr2) points, the addition, the subtraction and the shift in the first in-first out memory being carried out within the same cycle.

3. The method according to claim 1, further comprising:
   establishing other warning signals according to at least one of detection by spectral analysis, detection by interpolation filter, or time differentiation method; and
   combining the other warning signals to determine a turn-off command for the electrical circuit.

4. The method according to claim 3, wherein the input signal (S) includes the current signal (I), the determination of the turn-off command (C) taking into account an intensity of the current signal (I) during the warning period, a frequency of the warning signals (N), and an average duration ($t_{arc}$) of the warning signal.

5. The method according to claim 4, wherein a cut-out command is issued if a pair frequency (N) of the warning signals and average duration ($t_{arc}$) of the warning signals is above a first curve with a decreasing hyperbolic form, or if a pair warning current intensity and average duration is above a second curve with a decreasing hyperbolic form.

6. The method according to claim 1, further comprising storing in a respective register of a frequency memory respective frequencies of the respective levels, wherein the comparing of the frequency of each level is performed by comparing the respective stored frequencies of the respective levels to respective warning thresholds to determine if the input signal is constant.

7. A detection circuit for detecting the presence of an electrical arc in an electrical circuit powered with alternating current according to a power supply period, the detection circuit comprising:

measurement means for establishing at least one input signal (S) from between a voltage signal (U) and a current signal (I) respectively representative of the voltage (U) and of the current intensity (I) supplying the electrical circuit, the detection circuit being configured for delivering a warning signal (A1) indicating that an electrical arc is occurring when the input signal (S) is constant over at least a part of the power supply period, sampling means for digitally sampling the input signal (S) when it is measured according to predetermined levels;

processing means for identifying that the input signal (S) is constant, determining a frequency at which each level is reached by the input signal (S) over a predetermined time window, comparing the frequency of each level with a predetermined warning threshold, and delivering the warning signal if the frequency of at least one of the levels is greater than the warning threshold.

8. An electrical switching device comprising:

switching means for opening and closing an electrical circuit powered with alternating current according to a power supply period: and a detection circuit for controlling the switching means, wherein the detection circuit comprises:

measurement means for establishing at least one input signal (S) from between a voltage signal (U) and a current signal (I) respectively representative of the voltage (U) and of the current intensity (I) supplying the electrical circuit, the detection circuit being configured for delivering a warning signal (A1) indicating that an electrical arc is occurring when the input signal (S) is constant over at least a part of the power supply period, sampling means for digitally sampling the input signal (S) when it is measured according to predetermined levels; and processing means for identifying that the input signal (S) is constant, determining a frequency at which each level is reached by the input signal (S) over a predetermined time window, comparing the frequency of each level with a predetermined warning threshold, and delivering the warning signal if the frequency of at least one of the levels is greater than the warning threshold.

* * * * *